(12) United States Patent
Inazuki et al.

(10) Patent No.: US 8,841,048 B2
(45) Date of Patent: Sep. 23, 2014

(54) PHOTOMASK BLANK, PHOTOMASK, AND MAKING METHOD

(75) Inventors: Yukio Inazuki, Joetsu (JP); Shinichi Igarashi, Joetsu (JP); Kazuhiro Nishikawa, Joetsu (JP); Hiroki Yoshikawa, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/590,315

(22) Filed: Aug. 21, 2012

(65) Prior Publication Data

US 2013/0059235 A1    Mar. 7, 2013

(30) Foreign Application Priority Data

Sep. 7, 2011   (JP) .................................. 2011-195049

(51) Int. Cl.
  *G03F 1/00* (2012.01)
  *G03F 1/26* (2012.01)
  *G03F 1/38* (2012.01)
  *G03F 1/50* (2012.01)

(52) U.S. Cl.
  CPC .. *G03F 1/26* (2013.01); *G03F 1/14* (2013.01); *G03F 1/38* (2013.01); *G03F 1/50* (2013.01)
  USPC .......................................................... 430/5

(58) Field of Classification Search
  USPC ............................................................ 430/5
  See application file for complete search history.

(56) References Cited

U.S. PATENT DOCUMENTS

| | | | |
|---|---|---|---|
| 5,830,607 A | 11/1998 | Isao et al. | |
| 7,611,808 B2* | 11/2009 | Ushida et al. | 430/5 |
| 7,625,676 B2* | 12/2009 | Yoshikawa et al. | 430/5 |
| 7,767,367 B2* | 8/2010 | Yoshikawa et al. | 430/5 |
| 7,989,124 B2* | 8/2011 | Yoshikawa et al. | 430/5 |
| 8,003,284 B2* | 8/2011 | Yoshikawa et al. | 430/5 |
| 8,012,654 B2* | 9/2011 | Yoshikawa et al. | 430/5 |
| 8,148,036 B2 | 4/2012 | Inazuki et al. | |
| 2007/0212618 A1* | 9/2007 | Yoshikawa et al. | 430/5 |
| 2010/0261099 A1* | 10/2010 | Yoshikawa et al. | 430/5 |
| 2010/0261100 A1* | 10/2010 | Yoshikawa et al. | 430/5 |
| 2010/0261101 A1* | 10/2010 | Yoshikawa et al. | 430/5 |
| 2012/0100466 A1* | 4/2012 | Hashimoto et al. | 430/5 |

FOREIGN PATENT DOCUMENTS

| | | |
|---|---|---|
| EP | 2 237 107 B1 | 5/2002 |
| EP | 1 832 926 A2 | 9/2007 |
| EP | 1 832 926 A3 | 9/2007 |

(Continued)

OTHER PUBLICATIONS

The Communication and Extended Search Report, dated Apr. 25, 2014, issued in the corresponding European Patent Application No. 12182130.0.

*Primary Examiner* — Stewart Fraser
(74) *Attorney, Agent, or Firm* — Birch, Stewart, Kolasch & Birch, LLP

(57) ABSTRACT

In a photomask blank comprising a transparent substrate, an optical film of material containing a transition metal and silicon, and a hard mask film, the hard mask film is a multilayer film including a first layer of a chromium-based material containing 20-60 atom % of oxygen and a second layer of a chromium-based material containing at least 50 atom % of chromium and less than 20 atom % of oxygen. The hard mask film having a thickness of 2.0 nm to less than 10 nm is resistant to fluorine dry etching.

18 Claims, 3 Drawing Sheets

(56) References Cited

FOREIGN PATENT DOCUMENTS

| JP | 7-140635 A | 6/1995 |
| JP | 2007-241060 A | 9/2007 |
| JP | 2010-237499 A | 10/2010 |
| WO | WO 2010/113475 A1 | 10/2010 |

* cited by examiner

PHOTOMASK BLANK, PHOTOMASK, AND MAKING METHOD

CROSS-REFERENCE TO RELATED APPLICATION

This non-provisional application claims priority under 35 U.S.C. §119(a) on Patent Application No. 2011-195049 filed in Japan on Sep. 7, 2011, the entire contents of which are hereby incorporated by reference.

TECHNICAL FIELD

This invention relates to a photomask blank, a photomask, and preparation of the photomask. The photomask is used in the microfabrication of semiconductor integrated circuits, charge-coupled devices (CCD), liquid crystal display (LCD) color filters, magnetic heads or the like.

BACKGROUND ART

In the recent semiconductor processing technology, a challenge to higher integration of large-scale integrated circuits places an increasing demand for miniaturization of circuit patterns. There are increasing demands for further reduction in size of circuit-constructing wiring patterns and for miniaturization of contact hole patterns for cell-constructing interlayer connections. As a consequence, in the manufacture of circuit pattern-bearing photomasks for use in the photolithography of forming such wiring patterns and contact hole patterns, a technique capable of accurately writing finer circuit patterns is needed to meet the miniaturization demand.

In order to form a higher accuracy photomask pattern on a photomask substrate, it is of first priority to form a high accuracy resist pattern on a photomask blank. Since the photolithography carries out reduction projection in actually processing semiconductor substrates, the photomask pattern has a size of about 4 times the actually necessary pattern size, but an accuracy which is not loosened accordingly. The photomask serving as an original is rather required to have an accuracy which is higher than the pattern accuracy following exposure.

Further, in the currently prevailing lithography, a circuit pattern to be written has a feature size far smaller than the wavelength of light used. If a photomask pattern which is a mere 4-time magnification of the circuit feature is used, a shape corresponding exactly to the photomask pattern is not transferred to the resist film owing to influences such as optical interference occurring in the actual photolithography operation. To mitigate these influences, in some cases, the photomask pattern must be designed to a shape which is more complex than the actual circuit pattern, i.e., a shape to which the so-called optical proximity correction (OPC) is applied. Thus, at the present, the lithography technology for obtaining photomask patterns also requires a higher accuracy processing method. The lithographic performance is sometimes represented by a maximum resolution. As to the resolution limit, the lithography involved in the photomask processing step is required to have a maximum resolution accuracy which is equal to or greater than the resolution limit necessary for the photolithography involved in the semiconductor processing step using a photomask.

From a photomask blank having an optical film (e.g., light-shielding film or phase shift film) on a transparent substrate, a photomask pattern is generally formed by coating a photoresist film on the blank, writing a pattern using electron beam, and developing to form a resist pattern. With the resulting resist pattern made an etch mask, the optical film is then etched into an optical film pattern. In an attempt to miniaturize the optical film pattern, if processing is carried out while maintaining the thickness of the resist film at the same level as in the art prior to the miniaturization attempt, the ratio of film thickness to feature width, known as aspect ratio, becomes greater. As a result, the resist pattern profile is degraded to prevent effective pattern transfer, and in some cases, resist pattern collapse or stripping can occur. Therefore, the thickness of resist film must be reduced in harmony with the degree of miniaturization. However, as the resist film becomes thinner, the resist pattern is more susceptible to damage during dry etching of the optical film, undesirably resulting in a lowering of dimensional accuracy of a printed pattern.

One known method of producing a high accuracy photomask using a thinner resist film involves forming a film separate from the optical film (e.g., light-shielding film or halftone phase shift film) as a processing-aid film. Specifically, a hard mask film is formed between the resist film and the optical film, the resist pattern is transferred to the hard mask film, and dry etching of the optical film is then carried out using the resulting hard mask pattern. JP-A 2007-241060 discloses an exemplary method capable of forming a finer pattern. With the intention to establish finer photolithography technology, a light-shielding film is formed of a material containing a transition metal and silicon capable of shielding ArF excimer laser light despite a thinner film, and a chromium-based material film is used as the hard mask film for processing of the light-shielding film, whereby high accuracy processing becomes possible. Also, JP-A 2010-237499 discloses a photomask of similar construction to JP-A 2007-241060 wherein the hard mask film is of multilayer structure so that the stress introduced during deposition thereof may be mitigated, for thereby preventing any drop of processing accuracy during preparation of a photomask.

CITATION LIST

Patent Document 1: JP-A 2007-241060
(U.S. Pat. No. 7,989,124, EP 1832926)
Patent Document 2: JP-A 2010-237499
(U.S. Pat. No. 8,148,036, EP 2237107)
Patent Document 3: JP-A H07-140635

SUMMARY OF INVENTION

The introduction of the immersion lithography, double patterning method or the like ensures that the photolithography using ArF excimer laser light survives to the 32-nm node as the semiconductor processing criterion. There is a possibility that the ArF photolithography will be applied to ultra-fine structures. For a photomask for forming such a fine pattern, the permissible error is naturally reduced and a high accuracy of patterning is necessary. To form a finer pattern, in turn, the resist film must be thinner. Then the mask processing technology using a hard mask film becomes more useful, and a further improvement thereof is needed.

For example, when a hard mask film itself is processed using the resist pattern, one of important considerations is to improve the processing accuracy. As pointed out in Patent Document 1, a chromium-based material film if thick tends to undergo side etching when subjected to standard dry etching with oxygen-containing chlorine gas, and processing errors can occur due to the pattern density dependence or optical proximity effect. Thus the hard mask film of chromium-based material allows for a higher accuracy of processing as it becomes thinner. Patent Documents 1 and 2 disclose use of a chromium nitride film of 10 nm thick.

However, when the resist pattern to be formed includes finer features as in the manufacture of a photomask intended for printing of a 32-nm node resist pattern, a resist film used in processing of the hard mask film must have a thickness of less than 100 nm. This, in turn, requires that a hard mask film having a thickness of less than 10 nm be used and processed.

An object of the invention is to provide a photomask blank comprising an optical film of material containing a transition metal and silicon and a hard mask film of chromium-based material wherein the hard mask film is thin enough to enable a higher accuracy of processing the optical film into a fine pattern; a photomask manufactured from the photomask blank; and a method for manufacturing the photomask.

In order to reduce the thickness of the hard mask film, the inventors studied how hard mask films were resistant against fluorine-based dry etching. Specifically, hard mask films of multilayer construction were examined for etch resistance. It has been found that a significant improvement in resistance to fluorine-based dry etching is observable when the layer of a hard mask film formed on the side contiguous to the processable or target film of material containing a transition metal and silicon is an oxygen-containing chromium-based material layer, specifically a layer having a higher oxygen content than a layer formed for imparting high resistance to fluorine-based dry etching to the hard mask film.

Regarding a photomask blank comprising a transparent substrate, an optical film disposed on the substrate and composed of a material containing a transition metal and silicon, and a hard mask film for precision processing of the optical film, the inventors have found that better results are obtained when the hard mask film is a multilayer film of chromium-based material, the multilayer film includes a first layer disposed contiguous to the optical film, composed of a chromium-based material containing 20 to 60 atom % of oxygen, and having a thickness of 0.5 nm to less than 5.0 nm, and a second layer disposed contiguous to the first layer, composed of a chromium-based material containing at least 50 atom % of chromium and having a lower oxygen content than the first layer, and the hard mask film has an overall thickness of 2.0 nm to less than 10 nm. On use of a very thin hard mask film of chromium-based material multilayer structure, the processable film or optical film of material containing a transition metal and silicon can be processed into a fine pattern without any loss of accuracy.

In one aspect, the invention provides a photomask blank comprising a transparent substrate, an optical film disposed on the substrate and composed of a material containing a transition metal and silicon, and a hard mask film for precision processing of the optical film. The hard mask film is a multilayer film of chromium-based material. The multilayer film includes a first layer disposed contiguous to the optical film, composed of a chromium-based material containing 20 to 60 atom % of oxygen, and having a thickness of 0.5 nm to less than 5.0 nm, and a second layer disposed contiguous to the first layer and composed of a chromium-based material containing at least 50 atom % of chromium and having a lower oxygen content than the first layer. The hard mask film has an overall thickness of 2.0 nm to less than 10 nm.

In a preferred embodiment, the multilayer film includes the first layer as the lowermost layer, the second layer as an intermediate layer, and a third layer disposed contiguous to the second layer and having a higher oxygen content than the second layer as the outermost layer. Preferably, the first layer has a thickness of 0.5 to 3.0 nm.

Typically, the optical film is a light-shielding film which preferably has a thickness of 35 to 60 nm. Most often, the transition metal is molybdenum.

The photomask blank may further comprise a resist film having a thickness of less than 100 nm on the hard mask film.

A photomask may be prepared from the photomask blank defined above.

In another aspect, the invention provides a method for preparing a photomask from the photomask blank defined above, comprising the steps of patterning the resist film, patterning the hard mask film, and patterning the optical film. The step of patterning the resist film includes imagewise writing by electron beam irradiation, the step of patterning the hard mask film includes dry etching with oxygen-containing chlorine-based gas, and the step of patterning the optical film includes dry etching with fluorine-based gas.

Advantageous Effects of Invention

The photomask blank of the invention is designed to enhance the resistance of a hard mask film to fluorine-based dry etching. Even on use of a thinner hard mask film, an optical film of material containing a transition metal and silicon can be processed at a high accuracy through the hard mask pattern.

Since the hard mask film is of multilayer construction, the hard mask film maintains its hard mask function during etching even when the low oxygen content layer of the hard mask film, which is difficult to etch at a high rate, is made thin. It is then possible to reduce the load applied to a resist film during processing of the hard mask film while maintaining the hard mask function against fluorine-based dry etching. This implies that the hard mask film can be processed at a high accuracy using a thinner resist film.

After the photomask blank is processed into a photomask by such patterning, the photomask is highly reliable on its use in the lithography of 32 nm node and below.

DESCRIPTION OF PREFERRED EMBODIMENTS

Figure 1A:
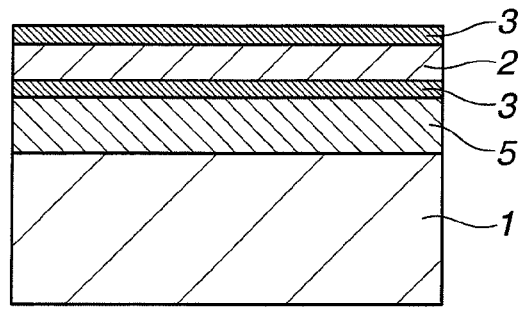
FIG. 1A illustrating a chromium-based material layer having a low chromium content and containing oxygen or having a high oxygen content disposed on a film of material containing a transition metal and silicon, and FIG. 1B illustrating a chromium-based material layer having a high chromium content and not containing oxygen or having a low oxygen content disposed on a film of material containing a transition metal and silicon.

In conjunction with processing of photomask blanks, it is known to utilize two films having different etching characteristics so that one film serves as a hard mask when the other film is etched. For example, Patent Document 1 discloses use of a light-shielding film of material containing a transition metal and silicon and a hard mask of chromium-based material. It is taught therein that when a chromium-based material film having a thickness sufficient to serve by itself as a light-shielding film is subjected to oxygen-containing chlorine-based dry etching through a resist pattern, strong pattern density dependency (or optical proximity effect) manifests, leading to a lowering of processing accuracy; and that when a chromium-based material film is used as a hard mask film, the hard mask film itself and a light-shielding film of material containing a transition metal and silicon via the hard mask pattern can be processed at a high accuracy as long as a hard mask film having a thickness of less than 30 nm is used.

Further, Patent Document 1 proposes a minimum thickness of 2 nm for the hard mask film used when a light-shielding film of material containing a transition metal and silicon for photomasks for the ArF excimer laser lithography is processed, and describes that a CrN film having a thickness of 10 nm allows for high accuracy processing. Also, Patent Document 2 discloses a photomask blank from which a photomask for use in the 45-nm node lithography is manufactured. It is confirmed that a hard mask film of chromium-based material having a thickness of 10 nm wherein one half of the film thickness is constructed by a chromium-based material film containing oxygen in a relatively high concentration to cause a loss of resistance to fluorine-based dry etching is still useful as the hard mask film. It is taught therein that a hard mask film of chromium-based material having a thickness of 10 nm wherein one half of the film thickness is constructed by a chromium-based material having a relatively high oxygen concentration can be processed through a resist film having a thickness of about 100 nm.

However, if it is desired to form a mask pattern of finer size and higher accuracy, especially compatible with the 32-nm node lithography or below, in some cases, a resist film having a thickness as used in the prior art cannot be used and instead, a resist film having a thickness of less than 100 nm must be used. In such cases, the processing accuracy of the hard mask film itself may be reduced unless a chromium-based material film having a thickness of less than 10 nm is used as the hard mask film. On the other hand, it is expected that when the hard mask film is merely made thinner, the hard mask film may lose its own function of providing resistance to fluorine-based dry etching.

The invention provides a photomask blank comprising a hard mask film of chromium-based material in which the thickness of the hard mask film is reduced such that the resulting thin hard mask film allows for high accuracy processing through a thinner resist film and still maintains high resistance to fluorine-based dry etching.

While a chromium-based material film having a higher chromium content possesses higher resistance to fluorine-based dry etching, the same film has a tendency that when the film itself is processed patternwise by oxygen-containing chlorine-based dry etching, the etching rate is retarded. This poses a greater load to the resist pattern, making it difficult to acquire a processing accuracy. Also as will be described later, when a hard mask film of chromium-based material is processed using a resist film which is deposited directly thereon, it is preferred from the aspect of forming a resist pattern of better profile that the hard mask film has been oxidized at its surface. Also on patternwise irradiation of EB, the presence of a layer having a high chromium content is preferred. Based on these findings, the inventors sought a possibility of forming a hard mask film from a multilayer film based on a combination of layers having different oxygen contents that comprehensively meets the above-mentioned requirements.

In a series of experiments, multilayer films were prepared from two or three layers so as to have an identical overall thickness and compared with respect to resistance to fluorine-based dry etching. It has been found that when a layer of a hard mask film contiguous to a film of material containing a transition metal and silicon which is a processable film to be processed using the hard mask film, that is, the lowermost layer of a hard mask film is an oxygen-containing chromium-based material layer, specifically a chromium-based material layer having a higher oxygen content than a layer formed for imparting high resistance to fluorine-based dry etching to the hard mask film, the fluorine-based dry etching resistance of the hard mask film is significantly improved over the hard mask film free of such lowermost layer.

Figure 1B:
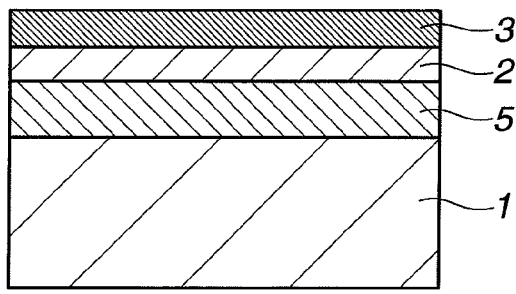
FIG. 1 illustrates in cross section a photomask blank comprising a multilayer hard mask film consisting of layers having different thickness.

This difference will be understood by referring to FIG. 1. FIG. 1A illustrates an exemplary photomask blank comprising a hard mask film in which the lowermost layer is a layer having a higher oxygen content than a layer for imparting high resistance to fluorine-based dry etching. FIG. 1B illustrates another exemplary photomask blank in which the lowermost layer is otherwise.

In either of these examples, a film of material containing a transition metal and silicon 5 is formed on a transparent substrate 1. In FIG. 1A, a chromium-based material layer 3 having a low chromium content and containing oxygen or having a high oxygen content is formed on the film of material containing a transition metal and silicon 5, a chromium-based material layer 2 having a high chromium content and not containing oxygen or having a low oxygen content is formed thereon as the layer for imparting high resistance to fluorine-based dry etching, and another chromium-based material layer 3 having a low chromium content and containing oxygen or having a high oxygen content is formed atop. In FIG. 1B, on the other hand, a chromium-based material layer 2 having a high chromium content and not containing oxygen or having a low oxygen content is formed directly on a film of material containing a transition metal and silicon 5 as the layer for imparting high resistance to fluorine-based dry etching, and a chromium-based material layer 3 having a low chromium content and containing oxygen or having a high oxygen content is formed atop.

The chromium-based material layers 2 in both the examples are formed of chromium-based material of the same composition and have an equal thickness. The chromium-based material layers 3 in both the examples are also formed of chromium-based material of the same composition, whereas the chromium-based material layers 3 in FIG. 1A each have a thickness which is one half of the thickness of chromium-based material layer 3 in FIG. 1B. Thus the total thickness of three chromium-based material layers 3, 2, 3 of the hard mask film in FIG. 1A is equal to the total thickness of two chromium-based material layers 2, 3 of the hard mask film in FIG. 1B.

These hard mask films of chromium-based material multilayer construction are compared for a rate of fluorine-based dry etching, provided that the hard mask films have an identical overall thickness. The hard mask film of multilayer construction in which the layer contiguous to the film of material containing a transition metal and silicon is a layer having a higher oxygen content than the layer for imparting high resistance to fluorine-based dry etching as shown in FIG. 1A is improved in resistance to fluorine-based dry etching over the hard mask film not having such a layer as shown in FIG. 1B.

It is believed that the following reason accounts for this phenomenon although the invention is not bound by any theory. When a chromium-based material film is deposited on a film of material containing a transition metal and silicon, chromium atoms and silicon atoms or transition metal atoms migrate mutually, though in minute amount. As a result, the fluorine-based dry etching resistance of chromium-based material becomes less than the original resistance of chromium-based material. It is believed herein that if the layer of the chromium-based material film which is disposed contiguous to the film of material containing a transition metal and silicon contains oxygen, this oxygen-containing layer functions as an element migration-inhibiting layer for thereby restraining atom migration and avoiding any loss of etch resistance as mentioned above.

The photomask blank of the invention is defined as comprising a transparent substrate, typically quartz substrate, an optical film (which is a processable film) disposed on the substrate and composed of a material containing a transition metal and silicon, and a hard mask film for precision processing of the optical film.

The hard mask film of chromium-based material used herein is described in further detail. The hard mask film used herein exhibits high resistance to fluorine-based dry etching even when it is a thin film. It is designed on the assumption that a hard mask film having an overall thickness of less than 10 nm, especially less than 9.5 nm is used. The hard mask film functions well when its thickness is preferably equal to or less than 6.0 nm, more preferably equal to or less than 4.0 nm. On the other hand, the overall thickness of the hard mask film should be equal to or more than 2.0 nm to maintain its own hard mask function relative to the optical film of material containing a transition metal and silicon.

Figure 2:
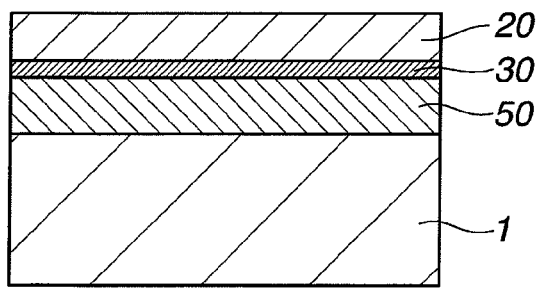
FIG. 2 is a cross-sectional view of a photomask blank in one embodiment of the invention.
Figure 3:
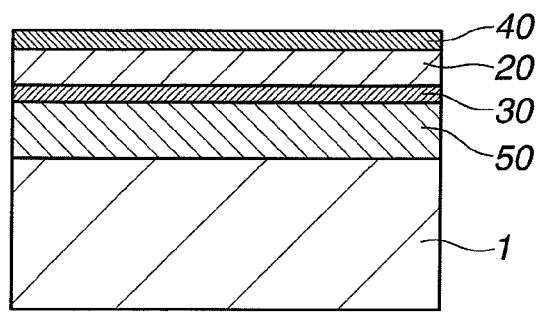
FIG. 3 is a cross-sectional view of a photomask blank in another embodiment of the invention.

As shown in FIGS. 2 and 3, for example, the hard mask film used herein is formed on an optical film 50 of material containing a transition metal and silicon disposed on a transparent substrate 1. In on embodiment shown in FIG. 2, the hard mask film is constructed as a multilayer film including a first layer 30 of oxygen-containing chromium-based material disposed contiguous to the optical film 50, and a second layer 20 of chromium-based material disposed contiguous to the first layer 30 and having a higher chromium content and a lower oxygen content than the first layer 30.

In the preferred embodiment shown in FIG. 3, the hard mask film is constructed as a multilayer film including the first layer 30 as the lowermost layer, the second layer 20 as an intermediate layer, and a third layer 40 disposed contiguous to the second layer 20 and having a higher oxygen content than the second layer 20 as the outermost layer.

When the multilayer films of FIGS. 2 and 3 are compared with the film of FIG. 1A, the first layer 30 corresponds to the chromium-based material layer 3 having a low chromium content and containing oxygen or having a high oxygen content as the lowermost layer, and the second layer 20 corresponds to the chromium-based material layer 2 having a high chromium content and not containing oxygen or having a low oxygen content as the layer for imparting high resistance to fluorine-based dry etching.

The hard mask film used herein is made of a chromium-based material which contains chromium metallic element as the main constituent, and a light element selected from oxygen, nitrogen and carbon as optional constituent, and may further contain up to 5 mol % of hydrogen, helium or the like as minor constituent.

The multilayer film as used herein encompasses not only a combination of a plurality of strictly discriminable layers, but also a film including a compositionally graded region that is a region whose composition gradually changes in thickness direction. In the latter case, it suffices that regions having the compositions of the first and second layers, or the first, second and third layers are disposed in the desired arrangement in the hard mask film.

The first layer of the hard mask film used herein is a layer of chromium-based material containing 20 to 60 atom %, preferably 30 to 60 atom % of oxygen. The first layer may contain nitrogen, and if any, preferably contains up to 40 atom %, more preferably 5 to 30 atom % of nitrogen. Also the first layer may contain carbon, and if any, preferably contains up to 10 atom %, more preferably up to 5 atom % of carbon. It is noted that the chromium content of the first layer is preferably up to 80 atom %, more preferably up to 70 atom %, and most preferably 40 to 60 atom %.

In order that the first layer of an oxygen-containing chromium-based material exert the effect of enhancing resistance to fluorine-based dry etching, the first layer should have a minimum thickness of 0.5 nm, preferably a thickness of at least 0.7 nm, more preferably at least 1.0 nm, because an extremely thin layer fails to insure a necessary thickness in microscopic domains due to problems of accuracy during deposition. If the thickness of the first layer is equal to or more than 5.0 nm, the hard mask film may have too large an overall thickness and undesirably deviate from the intended purpose of making the hard mask film as thin as possible. Thus the first layer should have a thickness of less than 5.0 nm, preferably up to 3.0 nm, and more preferably up to 2.0 nm.

In the hard mask film, the second layer disposed contiguous to the first layer is a layer of chromium-based material containing at least 50 atom %, preferably at least 60 atom % of chromium. The oxygen content of the second layer is lower than that of the first layer, preferably less than 20 atom %, more preferably equal to or less than 10 atom %. Most preferably the second layer is free of oxygen. The second layer may contain nitrogen, and if any, preferably contains up to 40 atom %, more preferably 5 to 30 atom % of nitrogen. Also the second layer may contain carbon, and if any, preferably contains up to 10 atom %, more preferably up to 5 atom % of carbon.

The provision of the second layer, especially as an intermediate layer, ensures to maintain high resistance to fluorine-based dry etching even when the overall thickness of the hard mask film is reduced. Even though a hard mask film has an overall thickness of less than 10 nm, the desired hard mask function is ensured. While the EB lithography using an EB resist film is applied in the patternwise processing of a photomask blank into a photomask, the addition of the low oxygen concentration layer to the hard mask film is effective for rendering the hard mask film fully electroconductive, thereby preventing any trouble due to charge accumulation during patternwise irradiation of EB. To exert such effects, the second layer, especially as an intermediate layer should preferably have a thickness of at least 1.0 nm, more preferably at least 1.5 nm, and most preferably at least 2.0 nm. If the thickness of the second layer is equal to or more than 9.0 nm, the hard mask film may have too large an overall thickness. Thus the second layer preferably has a thickness of less than 9.0 nm, more preferably up to 6.0 nm, and most preferably up to 4.0 nm.

Further, when oxygen-containing chlorine-based dry etching is performed to transfer a resist pattern to the hard mask film, the second layer containing 5 to 30 atom % of nitrogen is effective for preventing the sidewall shape of the hard mask pattern from becoming disordered due to side etching of the hard mask film. Nitrogen may also be contained in the first layer and the third layer to be described later, and the nitrogen's effect of preventing sidewall shape disordering is also available with the third layer (as the outermost layer exposed to long etching) and the first layer.

In the hard mask film used herein, the second layer is preferably overlaid with a third layer having a higher oxygen content than the second layer. It is preferred to form the third layer as the outermost layer. The third layer is preferably a layer of chromium-based material having a higher oxygen content than the second layer and more preferably a layer of chromium-based material containing 10 to 60 atom %, especially 20 to 60 atom % of oxygen. The third layer may contain nitrogen, and if any, preferably contains up to 40 atom %, more preferably 5 to 30 atom % of nitrogen. Also the third layer may contain carbon, and if any, preferably contains up to 10 atom %, more preferably up to 5 atom % of carbon. It is noted that the chromium content of the third layer is preferably up to 90 atom %, more preferably up to 70 atom %, and most preferably 40 to 60 atom %.

The provision of the third layer of oxygen-containing chromium-based material as the outermost layer of the hard mask film ensures that a resist pattern of satisfactory profile is formed from a resist film which is deposited directly on the hard mask film. If the surface of the hard mask film is a layer having a low oxygen content, the surface layer can be further oxidized in any steps following the completion of the hard mask film so that the surface layer may deviate from the desired design. The provision of the third layer of oxygen-containing chromium-based material as the outermost layer inhibits the hard mask film surface from alteration. To exert such effects, the third layer should preferably have a thickness of at least 0.5 nm, more preferably at least 0.7 nm, and most preferably at least 1.0 nm. If the thickness of the third layer exceeds 5.0 nm, the hard mask layer may have too large an overall thickness. Thus the thickness of the third layer should preferably be less than 5.0 nm, more preferably up to 3.0 nm, and most preferably up to 2.0 nm.

Deposition of the hard mask film may be performed by a sputtering technique. The sputtering technique may be either DC or RF sputtering, as described in Patent Document 3, for example, and be conducted in any well-known way. The target used is typically a chromium target although a chromium target containing nitrogen may also be used.

The sputtering gas used may be any of well-known inert gases and reactive gases. Typically argon gas is used alone, or a combination of argon gas with nitrogen, nitrogen oxide, oxygen or carbon oxide gas may be used and adjusted so as to deposit the desired composition. The method of depositing a film whose composition changes stepwise or continuously to form a multilayer structure may be by performing deposition while the composition of the sputtering gas is stepwise or continuously changed, for example.

The gas pressure during film deposition may be determined as appropriate in consideration of the stress, chemical resistance and cleaning resistance of the resulting film. Chemical resistance is improved when the gas pressure is typically 0.01 to 1 Pa, more preferably 0.03 to 0.3 Pa. The flow rate of gases may be determined as appropriate so as to deposit the desired composition although it is usually in the range of 0.1 to 1000 sccm. The power applied across the sputtering target may be determined as appropriate in consideration of cooling efficiency, ease of control of deposition and the like although it is usually in the range of 0.1 to 10 $W/cm^2$.

The hard mask film is typically disposed contiguous to the optical film which is a processable film deposited on a transparent substrate. The processable material which can be advantageously used is a material containing a transition metal and silicon as proposed in Patent Documents 1 and 2 while the optical film may be a light-shielding film or a phase shift film, typically a halftone phase shift film. The hard mask film contemplated herein effectively functions particularly when used in processing of a light-shielding film which is designed so that its thickness may be minimized for the purpose of enabling high accuracy processing to form an ArF excimer laser binary mask, more particularly when used in processing of a light-shielding film of material containing a transition metal and silicon having a thickness of about 35 to 60 nm. If a light-shielding film consists of a light-shielding function layer and an anti-reflecting function layer, a film including both the layers is referred to as "light-shielding film." Since the light-shielding film of material containing a transition metal and silicon is designed so as to possess an optical density of at least 2.5 relative to ArF excimer laser light, that is, designed such that a thin film may have a high optical density, there is a tendency that the surface oxidized layer becomes thinner. Therefore, when a hard mask film of chromium-based material is disposed on the light-shielding film, there is a likelihood that transition metal atoms and silicon atoms migrate into the chromium-based material film. In this situation, the hard mask film used herein is quite effective.

Described below is the light-shielding film in the form of a film of material containing a transition metal and silicon having an optical density of at least 2.5 at a thickness of about 35 to 60 nm, to which the hard mask film used herein is advantageously applicable.

The photomask blank comprising a light-shielding film to which the hard mask film used herein is advantageously applicable is typically a binary photomask blank from which a binary photomask bearing a fine pattern of two portions, light-transmissive and shielding portions necessary for the fabrication of semiconductor devices of 32-nm node or later is produced. The binary photomask blank comprises a transparent substrate, typically quartz substrate and a light-shielding film having an optical density of 2.5 to 3.5. In the binary photomask blank, a portion where the light-shielding film has been removed and the transparent substrate is left alone becomes the light-transmissive portion whereas a portion where the light-shielding film is present or remains on the transparent substrate becomes the light-shielding portion. This light-shielding film, intended for the binary photomask application, should have an optical density of at least 2.5, preferably at least 3.0, and is designed such as to ensure the desired light-shielding capability even at a thickness of up to 60 nm, specifically up to 55 nm, more specifically up to 50 nm, by virtue of the layer arrangement as will be described later. It is noted that the thickness of the light-shielding film is typically at least 35 nm, preferably at least 40 nm. Since the thickness of the light-shielding film is reduced to such a range, the light-shielding film may be processed to produce a mask having a high accuracy necessary for the lithography of 32-nm node or later.

Figure 4A:
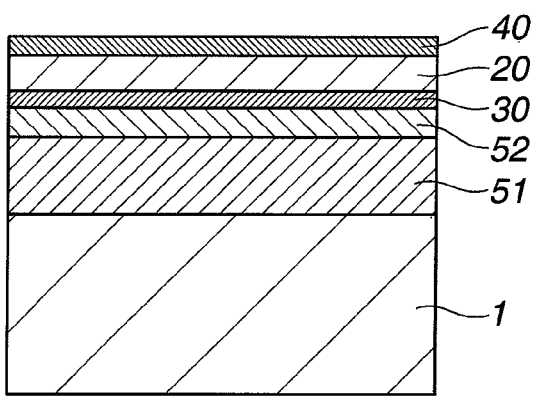
FIG. 4A illustrating a light-shielding film consisting of a substrate-side compositionally graded layer and a surface-side compositionally graded layer, and FIG. 4B illustrating a light-shielding film consisting of a substrate-side compositionally graded layer, an intermediate light-shielding layer, and a surface-side compositionally graded layer.
Figure 4B:
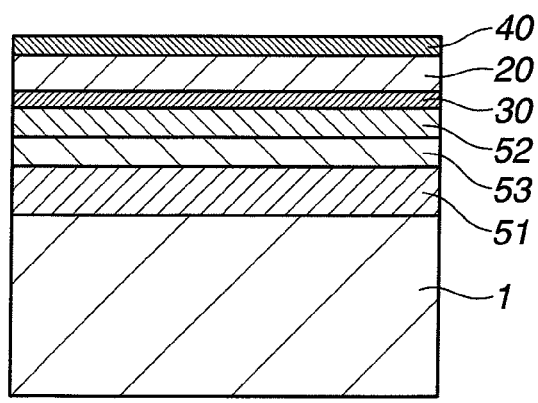
FIG. 4 is a cross-sectional view of a photomask blank in a further embodiment of the invention.

Exemplary photomask blanks comprising a film of material containing a transition metal and silicon of about 35 to 60 nm thick which is a light-shielding film having an optical density of at least 2.5 include a blank having a transparent substrate 1 and a light-shielding film consisting of a substrate-side compositionally graded layer 51 on the side of transparent substrate 1 and a surface-side compositionally graded layer 52 as shown in FIG. 4A, and a blank further having an intermediate light-shielding layer 53 between the substrate-side compositionally graded layer 51 and the surface-side compositionally graded layer 52 as shown in FIG. 4B. The intermediate light-shielding layer 53 should have an essential function of imparting a light shielding capability to the light-shielding film while the other function and structure thereof are not particularly limited. The light-shielding film is composed of a silicon compound material containing a transition metal such as molybdenum, tantalum, titanium or tungsten, nitrogen and/or oxygen, and optionally carbon. Among others, those materials containing molybdenum as the transition metal are easy to process, and those silicon compound materials containing molybdenum and nitrogen are more preferred. It is noted that in FIGS. 4A and 4B, the layers of the hard mask film are depicted by the same characters as in FIG. 3, and their description is omitted for avoiding redundancy.

The light-shielding film in the form of a film of material containing a transition metal and silicon having a thickness of about 35 to 60 nm and an optical density of at least 2.5 preferably has a layer arrangement including compositionally graded layers each having a total content of nitrogen and oxygen which changes in thickness direction of the light-shielding film, on the back side of the light-shielding film contiguous to the substrate and the front side of the light-shielding film remote from the substrate. In this embodiment, each compositionally graded layer may be a layer whose composition changes continuously in thickness direction, a combination of a plurality of sub-layers of a fixed composition, a combination of a sub-layer of a fixed composition with a sub-layer whose composition changes continuously in thickness direction, or a combination of a plurality of sub-layers whose composition each changes continuously in thickness direction. The compositionally graded layer is of such layer construction that its absorption coefficient changes discontinuously or continuously in thickness direction.

The substrate-side compositionally graded layer of the light-shielding film may be a layer whose composition changes continuously in thickness direction, a combination of at least three sub-layers each of a single composition, a combination of a sub-layer of a single composition with a sub-layer whose composition changes continuously in thickness direction, or a combination of a plurality of sub-layers whose composition each changes continuously in thickness direction. It is preferably a layer whose composition changes in thickness direction and which has a low absorption coefficient of exposure light at the substrate-adjoining surface and a high absorption coefficient of exposure light at the surface remote from the substrate.

Particularly, the substrate-side compositionally graded layer is preferably a layer which has, in part in thickness direction or in its entirety, a total content of nitrogen and oxygen that changes continuously in thickness direction. This layer construction enables effective reflection control at a preselected thickness without a substantial loss of light-shielding capability.

The substrate-side compositionally graded layer preferably has a thickness of 10 to 58.5 nm, more preferably 13 to 53.5 nm, and even more preferably 15 to 48.5 nm. Where the substrate-side compositionally graded layer is a multilayer structure consisting of single composition sub-layers, the number of sub-layers is at least 3, and the upper limit of the number of sub-layers is typically up to 20, though not critical. Where the substrate-side compositionally graded layer is a combination of a single composition sub-layer with a sub-layer whose composition changes continuously in thickness direction, or a combination of a plurality of sub-layers whose composition each changes continuously in thickness direction, the number of sub-layers is at least 2, and the upper limit of the number of sub-layers is typically up to 20, though not critical. Although a gap can form at the interface between sub-layers of substantially different compositions during etching, the risk of gap formation is prevented by the multi-layer structure comprising at least three single composition sub-layers or by incorporating a layer whose composition changes continuously in thickness direction.

The substrate-side compositionally graded layer is preferably composed of a silicon compound material containing a transition metal, nitrogen and/or oxygen, and optionally, carbon. An atomic ratio of transition metal to silicon is preferably from 1:2 to 1:9, more preferably from 1:2 to 1:5. The material may further contain a light element such as carbon, but it is preferred from the aspect of quality control that the total content of light elements other than nitrogen and oxygen be up to 3 atom %. More preferably the material does not contain light elements other than nitrogen, oxygen and carbon in an amount in excess of the amount of incidental impurities.

The substrate-side compositionally graded layer is preferably constructed such that the total content of nitrogen and oxygen at its surface adjacent the transparent substrate is 25 to 40 atom %, and the total content of nitrogen and oxygen at its surface remote from the transparent substrate is 10 to 23 atom %. The composition between the opposite surfaces is preferably such that the total content (atom %) of nitrogen and oxygen changes discontinuously or continuously in thickness direction, depending on the layer construction of the substrate-side compositionally graded layer, and more preferably increases in thickness direction toward the transparent substrate side (or decreases toward the side remote from the transparent substrate). Of nitrogen and oxygen, the layer preferably contains at least 3 atom %, more preferably at least 5 atom % of nitrogen, because after completion of mask processing using a hard mask film of chromium-based material according to the invention, the layer with such a nitrogen content prevents side etching during the step of removing the hard mask film by chlorine-based dry etching.

The substrate-side compositionally graded layer is formed thicker than the surface-side compositionally graded layer to be described below, whereby the reflectances of the light-shielding film at the front and back surfaces can be controlled to a value of not more than 40%, especially up to 35%.

In the embodiment wherein the light-shielding film is formed of a film of material containing a transition metal and silicon of about 35 to 60 nm thick such that it may have an optical density of at least 2.5, the light-shielding film may consist of a substrate-side compositionally graded layer and a surface-side compositionally graded layer and optionally an intermediate layer therebetween. In the latter embodiment, an exemplary light-shielding film formed on a transparent substrate 1 is shown in FIG. 4B. The light-shielding film includes a substrate-side compositionally graded layer 51 and a surface-side compositionally graded layer 52 stacked on the transparent substrate 1 and an intermediate light-shielding layer 53 between these layers 51 and 52.

The intermediate light-shielding layer may be a layer whose composition changes continuously throughout its thickness. The intermediate light-shielding layer on its substrate side may have a total content of nitrogen and oxygen which is graded inversely to the substrate-side compositionally graded layer, and on its surface side may have a total content of nitrogen and oxygen which is graded inversely to the surface-side compositionally graded layer. Basically the intermediate light-shielding layer is preferably a layer with a little compositional change, more preferably a layer of a single composition. Also the intermediate light-shielding layer is preferably composed of a silicon compound material containing a transition metal, nitrogen and/or oxygen, and optionally, carbon. An atomic ratio of transition metal to silicon is preferably from 1:2 to 1:9, more preferably from 1:2 to 1:5. The material may further contain a light element such as carbon, but it is preferred for reducing the absorption coefficient relative to exposure light that the total content of light elements other than nitrogen and oxygen be up to 3 atom %. More preferably the material does not contain light elements other than nitrogen, oxygen and carbon in an amount in excess of the amount of incidental impurities.

In the intermediate light-shielding layer, the total content of nitrogen and oxygen is preferably 10 to 23 atom %, more preferably 10 to 15 atom %. The total content of nitrogen and oxygen in the range ensures that the film meets both conductivity and chemical stability. While the content of light elements is preferably reduced as low as possible in order to provide a high absorption coefficient necessary as the light-shielding film as indicated above, the provision of an intermediate light-shielding layer having a total content of nitrogen and oxygen within the above range between the substrate-side compositionally graded layer and the surface-side compositionally graded layer leads to a light-shielding film having a good balance of overall thickness, reflection control capability and processing performance, which is advantageous in obtaining a satisfactory processing shape during dry etching. Also, the layer preferably contains at least 3 atom %, more preferably at least 5 atom % of nitrogen, because the layer with such a nitrogen content prevents side etching upon removal of the hard mask film as mentioned above.

The thickness of the intermediate light-shielding layer is designed so as to comply with the optical density needed by the overall light-shielding film and determined in accordance with the composition and thickness of the substrate and surface-side compositionally graded layers. Particularly in the light-shielding film of the invention, the substrate-side compositionally graded layer may have a thickness of at least 40 nm, and in such embodiments, the intermediate light-shielding layer need not necessarily be provided, and if provided, the intermediate light-shielding layer, despite its thickness of about 1 nm, may give the light-shielding film an optical density of at least 2.5 at a thickness of up to 60 nm. The thickness of the intermediate light-shielding layer is preferably up to 48.5 nm, more preferably 1 to 43.5 nm, and even more preferably 1 to 38.5 nm.

The surface-side compositionally graded layer which constitutes the surface side of the light-shielding film (which is disposed remote from the substrate) may be a layer whose composition changes continuously in thickness direction, a combination of at least three single composition sub-layers, a combination of a single composition sub-layer with a sub-layer whose composition changes continuously in thickness direction, or a combination of a plurality of sub-layers whose composition each changes continuously in thickness direction. It is preferably a layer whose composition changes in thickness direction and which has a high absorption coefficient of exposure light on the substrate-adjoining surface and a low absorption coefficient of exposure light on the surface remote from the substrate.

The surface-side compositionally graded layer has a thickness of 1.5 to 8 nm, preferably 3 to 6 nm. Where the surface-side compositionally graded layer is a multilayer structure consisting of single composition sub-layers, the number of sub-layers is at least 2, and the upper limit of the number of sub-layers is typically up to 5, though not critical. Where the surface-side compositionally graded layer is a combination of a single composition sub-layer with a sub-layer whose composition changes continuously in thickness direction, or a combination of a plurality of sub-layers whose composition each changes continuously in thickness direction, the number of sub-layers is at least 2, and the upper limit of the number of sub-layers is typically up to 5, though not critical. Although a gap can form at the interface between sub-layers of substantially different compositions during etching, the risk of gap formation is prevented by the multilayer structure comprising at least two single composition sub-layers or by incorporating a layer whose composition changes continuously in thickness direction. Since the surface-side compositionally graded layer is thinner than the substrate-side compositionally graded layer, the layer construction of even two sub-layers is fully effective for preventing the risk of gap formation during etching. Also since the surface-side compositionally graded layer is fully thin, a simpler layer construction like a combination of sub-layers whose composition is fixed in thickness direction or a layer whose composition changes continuously in thickness direction is advantageously used.

The surface-side compositionally graded layer is preferably composed of a silicon compound material containing a transition metal, nitrogen and/or oxygen, and optionally, carbon. An atomic ratio of transition metal to silicon is preferably from 1:2 to 1:9, more preferably from 1:2 to 1:6. The material may further contain a light element such as carbon, but it is preferred from the aspect of quality control that the total content of light elements other than nitrogen and oxygen be up to 3 atom %. More preferably the material does not contain light elements other than nitrogen, oxygen and carbon in an amount in excess of the amount of incidental impurities.

The surface-side compositionally graded layer is preferably constructed such that the total content of nitrogen and oxygen at its surface adjacent the transparent substrate is 10 to 45 atom %, preferably 20 to 40 atom %, and the total content of nitrogen and oxygen at its surface remote from the transparent substrate is 45 to 55 atom %, preferably 45 to 50 atom %. The composition between the opposite surfaces is preferably such that the total content (atom %) of nitrogen and oxygen changes discontinuously or continuously in thickness direction, depending on the layer construction of the surface-side compositionally graded layer, and more preferably decreases in thickness direction toward the transparent substrate side (or increases toward the side remote from the substrate). The layer preferably contains at least 3 atom %, more preferably at least 5 atom % of nitrogen, because the layer with such a nitrogen content prevents side etching upon removal of the hard mask film.

A sub-surface zone of the surface-side compositionally graded layer that extends a distance of about 1 nm from the surface may have an increased oxygen content due to cleaning step of the manufacture process or surface oxidation. For this reason, the sub-surface zone of the surface-side compositionally graded layer may be excluded from the layer for which the contents of elements are defined to the above ranges.

The surface-side compositionally graded layer is formed thinner than the substrate-side compositionally graded layer. Even in this situation, the reflectances of the light-shielding film at the front and back surfaces can be controlled to a value of not more than 40%, especially up to 35%.

In the most preferred embodiment, the light-shielding film includes a substrate-side compositionally graded layer comprising a layer whose composition changes continuously in thickness direction and having a thickness of 10 to 40 nm, an intermediate light-shielding layer having a thickness of 10 to 35 nm, and a surface-side compositionally graded layer having a thickness of up to 6 nm, in the described order from the transparent substrate.

As the method for depositing the light-shielding film (constituent layers of the light-shielding film), a sputtering technique is preferred because a homogeneous film can be formed most easily. The sputtering technique may be either DC or RF sputtering, with the DC sputtering being preferred. The method for depositing a film containing a transition metal, silicon, nitrogen and/or oxygen, and optionally carbon is well known. Basically, the film can be deposited by any well-known methods, as described in Patent Document 1, for example.

The compositional ratio of transition metal to silicon is adjustable. A single target having a transition metal/silicon ratio adjusted so as to give the desired composition may be used. Alternatively, a plurality of different targets are used and the powers applied to the targets are adjusted so as to give the desired compositional ratio. Examples of the target which can be used herein include a silicon target containing a transition metal, a combination of a transition metal target and a silicon target, a combination of a silicon target containing a transition metal and a silicon target, a combination of a transition metal target and a silicon target containing a transition metal, and a combination of a transition metal target, a silicon target containing a transition metal, and a silicon target.

The sputtering gas used may be any of well-known inert gases and reactive gases. Typically argon gas is used alone or a combination of argon gas with nitrogen, nitrogen oxide, oxygen or carbon oxide gas may be used and adjusted so as to deposit the desired composition. In order to adjust the absorption coefficient, an experiment is performed in advance. Empirically, each layer is deposited, the sputtering conditions and the deposition rate are confirmed, and the sputtering conditions for the substrate-side compositionally graded layer, intermediate light-shielding layer and surface-side compositionally graded layer of which the light-shielding film is composed are determined. A film of such layers is deposited while altering the sputtering conditions. When it is desired to deposit a film whose absorption coefficient changes stepwise or continuously, deposition is performed while the composition of the sputtering gas is stepwise or continuously changed, for example. Where a plurality of targets are used, the powers applied across the targets are stepwise or continuously changed, whereby the ratio of transition metal to silicon can be stepwise or continuously changed.

The gas pressure during film deposition may be determined as appropriate in consideration of the stress, chemical resistance and cleaning resistance of the resulting film. Chemical resistance is improved when the gas pressure is typically 0.01 to 1 Pa, more preferably 0.03 to 0.3 Pa. The power applied across the sputtering target may be determined as appropriate in consideration of target size, cooling efficiency, ease of control of deposition and the like although it is usually in the range of 0.1 to 5 W/cm$^2$.

Now the method for preparing a photomask from the photomask blank of the invention is described with reference to an embodiment wherein the light-shielding film is applied as the optical film. Understandably, in another embodiment wherein the optical film is a phase shift film such as a halftone phase shift film, the method for patterning the light-shielding film using the hard mask pattern is equally applicable.

Generally, the photomask blank of the invention may be processed by any well-known methods. In the case of a photomask blank comprising a thin chromium-based material film capable of exerting a hard mask function, an accurate pattern can be processed even using a resist film having a thickness of less than 100 nm. Thus the photomask blank may be processed into a photomask suitable for use in the fabrication of semiconductor devices of 32-nm node or later.

A resist film is used in the patterning of the photomask blank. Typically the resist film may be formed from an EB lithography chemically amplified resist composition comprising an aromatic polymer. The chemically amplified resist composition used to form a resist film may be either positive or negative, with a choice being made so as to comply with the desired pattern. A resist film which is as thin as 100 nm or less may be formed because such a thin resist film allows for subsequent processing. In the fabrication of a photomask for 32-nm node or later, the composition is preferably coated such that the prebaked coating may have a thickness of 40 to 80 nm. Film deposition is carried out by diluting the resist composition to an appropriate concentration, and coating it so that the coating may have a uniform thickness, typically by spin coating. Coating is followed by prebaking for removing any extra solvent. Typical prebaking is carried out on a hot plate at a temperature of 80 to 130° C. for 4 to 20 minutes, more preferably at 90 to 110° C. for 8 to 12 minutes.

Next, the resist film is subjected to patternwise exposure (or imagewise writing) for forming the desired pattern. In the step of forming a pattern of the resist film, the exposure may be patternwise irradiation of EB (that is, imagewise writing by EB irradiation) in a dose of 1 to 100 µC/cm$^2$, preferably 10 to 100 µC/cm$^2$. Following patternwise exposure, the resist film is baked (PEB) and developed in a developer. Typical PEB is carried out on a hot plate at a temperature of 60 to 150° C. for 0.1 to 5 minutes, more preferably at 80 to 140° C. for 0.5 to 3 minutes. Typical development is carried out in an alkaline aqueous solution, such as 0.1 to 5 wt %, preferably 2 to 3 wt % tetramethylammonium hydroxide (TMAH) for 0.1 to 3 minutes, preferably 0.5 to 2 minutes by a standard technique such as dip, puddle or spray development.

Next, the hard mask film is patterned while the resulting resist pattern serves as an etching mask. The step of patterning a hard mask film of chromium-based material may include chlorine dry etching using oxygen-containing chlorine based gas. For the chlorine dry etching, oxygen gas and chlorine based gas are used in a molar ratio of preferably 0.001/1 to 1/1, more preferably 0.003/1 to 0.5/1, and even more preferably 0.005/1 to 0.3/1. More specifically, suitable etching conditions include 100 to 300 sccm of chlorine gas, 0.1 to 100 sccm of oxygen gas and a gas pressure of 1 to 10 mTorr. Also 1 to 20 sccm of helium gas may be added. As used herein, the term "chlorine-based gas" refers to a chlorine-containing gas, typically chlorine gas.

Since the hard mask film of chromium-based material, in which the second layer with a high chromium content has a thickness of less than 9.0 nm, has an overall thickness of less than 10.0 nm, high accuracy transfer of a pattern to the hard mask film is possible even from the resist film which is very thin as defined above.

Next, the light-shielding film (which is a typical optical film of material containing a transition metal and silicon) is patterned while the resulting hard mask film pattern serves as an etching mask. The step of patterning a light-shielding film of material containing a transition metal and silicon may include dry etching using fluorine-containing gas. The "fluorine-containing gas" may be any gas containing fluorine, for example, fluorine gas, a gas containing carbon and fluorine such as $CF_4$ or $C_2F_6$, a gas containing sulfur and fluorine such as $SF_6$, optionally further containing hydrogen, and a mixture of fluorine-free gas such as helium and fluorine-containing gas. Optionally, another gas such as oxygen may be added. Under preferred etching conditions, oxygen-containing gas is used. For example, oxygen gas and fluorine-containing gas may be used in a molar ratio of 0.001/1 to 1000/1. More specifically, suitable etching conditions include 1 to 1000 sccm, preferably 10 to 100 sccm of fluorine-containing gas, 1 to 1000 sccm, preferably 10 to 100 sccm of oxygen gas and a gas pressure of 1 to 20 mTorr.

An advantage is obtainable in conjunction with dry etching through the hard mask pattern. Although the hard mask film including an oxygen-containing chromium-based material layer contiguous to the light-shielding film of material containing a transition metal and silicon is a thin film as a whole, the hard mask film has improved resistance to fluorine-based dry etching. Accordingly, the light-shielding film of material containing a transition metal and silicon can be processed at a high accuracy.

After pattern formation of the light-shielding film, the hard mask film is removed to complete a photomask. Removal of the hard mask film may be carried out by dry etching. Typically, the hard mask film may be removed by the same etching as used in the patterning of the hard mask film, without any damage to the light-shielding film contiguous to the hard mask film.

EXAMPLE

Examples of the invention are given below by way of illustration and not by way of limitation.
[Preparation of Binary Photomask Blank having Hard Mask film]

Example 1

A light-shielding film of MoSiN consisting of a substrate-side compositionally graded layer and a surface-side compositionally graded layer was deposited on a quartz substrate by a sputtering technique using a silicon target, a molybdenum silicide target, and argon and nitrogen gases as the sputtering gas. First, the substrate-side compositionally graded layer of 45 nm thick having an atomic ratio of Mo:Si=1:2.5 was deposited while continuously changing the nitrogen gas concentration so as to provide a nitrogen content of 29 atom % on the substrate side and a nitrogen content of 19 atom % on the side remote from the substrate. Subsequently, a sub-layer of 2 nm was deposited under such conditions as to provide an atomic ratio of Mo:Si=1:3.5 and a nitrogen content of 38 atom %, and another sub-layer of 2 nm was deposited under such conditions as to provide an atomic ratio of Mo:Si=1:3.5 and a nitrogen content of 47 atom %, yielding the surface-side compositionally graded layer consisting of two sub-layers. The resulting light-shielding film had a thickness of 49 nm, an optical density OD of 3.10 relative to light of wavelength 193 nm, and a light reflectance of 32% at the substrate side and 34% at the side remote from the substrate.

Next, a hard mask film was deposited on the light-shielding film. First, using a DC sputtering system, a lowermost layer of CrON was deposited to a thickness of 1.0 nm. Argon, nitrogen and oxygen gases were fed as the sputtering gas so as to give a flow rate ratio of $Ar:N_2:O_2$ 3:4:3 and a gas pressure of 0.05 Pa within the chamber. A Cr target was sputtered while rotating the substrate at 30 rpm. Separately, the lowermost layer was deposited on a transparent substrate under the same conditions and analyzed by ESCA, finding that the chromium-based material layer formed under these conditions had a composition of Cr:N:O=10:3:7 (atomic ratio).

Subsequent to deposition of the lowermost layer, an intermediate layer of 2.0 nm thick was deposited by changing the sputtering conditions, that is, feeding only argon and nitrogen gases in a flow rate ratio of $Ar:N_2$=3:1. Separately, the intermediate layer was deposited on a transparent substrate under the same conditions and analyzed by ESCA, finding that the chromium-based material layer formed under these conditions had a composition of Cr:N=9:1 (atomic ratio).

Subsequent to deposition of the intermediate layer, an outermost layer of 1.0 nm thick was deposited by changing the sputtering conditions, that is, feeding argon, nitrogen and oxygen gases in a flow rate ratio of $Ar:N_2:O_2$=3:4:3. A binary photomask blank having a hard mask film was thus obtained. Separately, the outermost layer was deposited on a transparent substrate under the same conditions and analyzed by ESCA, finding that the chromium-based material layer formed under these conditions had a composition of Cr:N:O=10:3:7 (atomic ratio).

Comparative Example 1

A binary photomask blank having a hard mask film was manufactured as in Example 1 except that a lowermost layer of 2.0 nm thick was deposited under the conditions for deposition of the intermediate layer in Example 1, the intermediate layer was omitted, and an outermost layer of 2.0 nm thick was deposited under the conditions for deposition of the outermost layer in Example 1.

Example 2

A binary photomask blank having a hard mask film was manufactured as in Example 1 except that the thickness of the lowermost, intermediate, and outermost layers was changed to 0.75 nm, 1.5 nm, and 0.75 nm, respectively.

Comparative Example 2

A binary photomask blank having a hard mask film was manufactured as in Example 1 except that a lowermost layer of 1.5 nm thick was deposited under the conditions for deposition of the intermediate layer in Example 1, the intermediate layer was omitted, and an outermost layer of 1.5 nm thick was deposited under the conditions for deposition of the outermost layer in Example 1.
[Evaluation of Etching Characteristics of Hard Mask Film]

Figure 5:
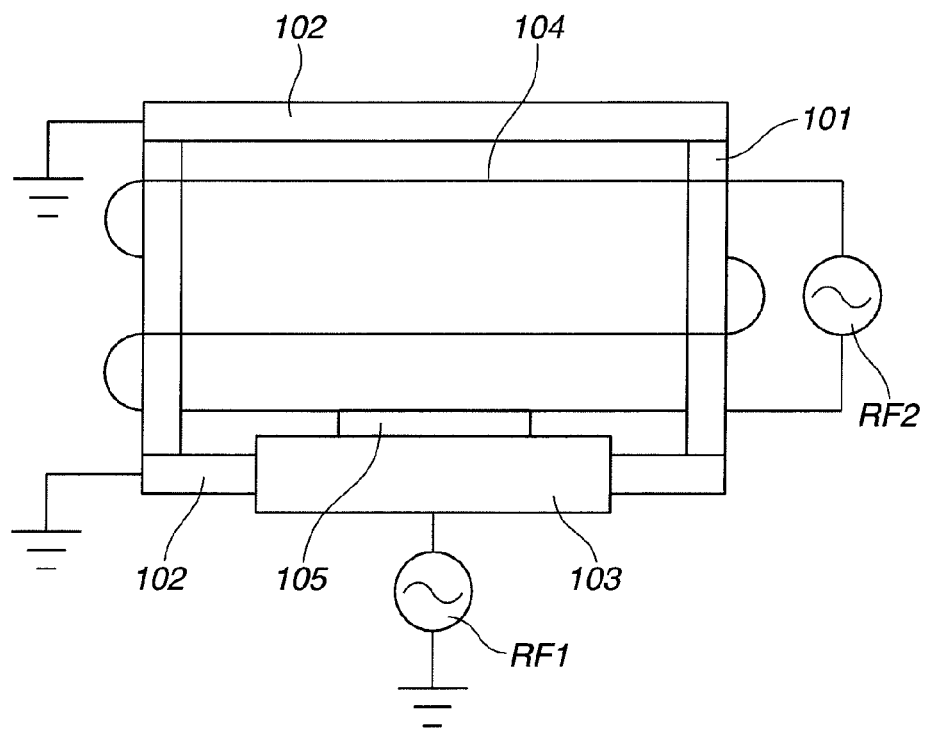
FIG. 5 schematically illustrates a dry etching system used in Examples and Comparative Examples.

The hard mask films of the photomask blanks of Examples 1, 2 and Comparative Examples 1, 2 were examined for ease of processing and etch resistance by effecting chlorine dry etching with oxygen-containing chlorine based gas and fluorine dry etching with fluorine based gas and measuring the etching time. The outline of a dry etching system used in these etching tests is illustrated in FIG. 5 as comprising a chamber 101, grounded plates 102, a lower electrode 103, an antenna coil 104, a substrate 105 to be treated, and radio frequency power supplies RF1 and RF2.

The fluorine dry etching test was under the following conditions.
RF1 (RIE): CW 54 V
RF2 (ICP): CW 325 W
Pressure: 5 mTorr
$SF_6$: 18 sccm
$O_2$: 45 sccm The oxygen-containing chlorine dry etching test was under the following conditions.
RF1 (RIE): pulse 700 V
RF2 (ICP): CW 400 W
Pressure: 6 mTorr
$Cl_2$: 185 sccm
$O_2$: 55 sccm
He: 9.25 sccm It is noted that RIE stands for reactive ion etching, ICP for inductively coupled plasma, and CW for continuous wave oscillation.

Table 1 tabulates the etching clear time of the hard mask films of Examples 1, 2 and Comparative Examples 1, 2 under the two sets of etching conditions.

TABLE 1

| | Hard mask film thickness (nm) | Etching clear time (sec) | |
|---|---|---|---|
| | | Fluorine | Chlorine |
| Example 1 | 4.0 | 181 | 18 |
| Comparative Example 1 | 4.0 | 148 | 16 |
| Example 2 | 3.0 | 103 | 14 |
| Comparative Example 2 | 3.0 | 95 | 11 |

Better etching performance is seen from Table 1, i.e., from a comparison between Example 1 and Comparative Example 1 and between Example 2 and Comparative Example 2 in which the hard mask film had an identical thickness. On chlorine-based dry etching employed for processing of the hard mask film, Example does not show a time difference which is of significance from the processing aspect as compared with Comparative Example. On fluorine-based dry etching, Example shows a significantly extended etching clear time over Comparative Example, indicating an improvement in etch resistance.

Preparation of Binary Photomask

Example 3

On the photomask blank prepared in Example 1, an ES lithography positive resist composition based on an aromatic polymer was coated to form a resist film of 80 nm thick, obtaining an EB resist film-covered photomask blank. A resist pattern including 45 nm and 400 nm line-and-space regions was formed therein as the photomask model pattern for 32 nm node. Specifically, the resist pattern was formed by using an EB mask writer system EBM-5000+ (Nuflare Technology, Inc.), writing a pattern including 45 nm and 400 nm line-and-space regions, baking and development in a standard way.

While the resulting resist pattern served as an etching mask, the hard mask film was etched under the chlorine dry etching conditions employed in the etching test of hard mask film. This transferred the resist pattern to the hard mask film, obtaining a hard mask pattern. While the resulting hard mask pattern served as an etching mask, the light-shielding film was etched under the fluorine dry etching conditions employed in the etching test of hard mask film. This transferred the hard mask pattern to the light-shielding film, obtaining a light-shielding film pattern. Finally, the hard mask film on the light-shielding film was removed under the chlorine dry etching conditions as described above. The hard mask film could be removed without any damage to the light-shielding film, yielding a binary photomask having a line-and-space pattern of light-shielding film.

The size of the light-shielding film pattern on the binary photomask was measured under a scanning electron microscope LWM9000 (Advantest Corp.). It was demonstrated that the line-and-space patterns had a satisfactory profile. From the line-and-space pattern regions designed to a size of 45 nm and 400 nm, line-and-space pattern regions having a size of 47 nm and 406 nm within the acceptable ranges, respectively, were reproduced in the light-shielding film.

Japanese Patent Application No. 2011-195049 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photomask blank comprising a transparent substrate, an optical film disposed on the substrate and composed of a material containing a transition metal and silicon, and a hard mask film for precision processing of the optical film, wherein
said hard mask film is a multilayer film of chromium-based material, the multilayer film including a first layer disposed contiguous to the optical film, composed of a chromium-based material containing 20 to 60 atom % of oxygen, and having a thickness of 0.5 nm to less than 5.0 nm, and a second layer disposed contiguous to the first layer and composed of a chromium-based material containing at least 50 atom % of chromium and having a lower oxygen content than the first layer, and
said hard mask film has an overall thickness of 2.0 nm to less than 10 nm.

2. The photomask blank of claim 1 wherein said multilayer film includes the first layer as the lowermost layer, the second layer as an intermediate layer, and a third layer disposed contiguous to the second layer and having a higher oxygen content than the second layer as the outermost layer.

3. The photomask blank of claim 1 wherein the first layer has a thickness of 0.5 to 3.0 nm.

4. The photomask blank of claim 1 wherein the optical film is a light-shielding film.

5. The photomask blank of claim 4 wherein the light-shielding film has a thickness of 35 to 60 nm.

6. The photomask blank of claim 1 wherein the transition metal is molybdenum.

7. The photomask blank of claim 1, further comprising a resist film having a thickness of less than 100 nm on the hard mask film.

8. A photomask which is prepared from the photomask blank of claim 1.

9. A method for preparing a photomask from the photomask blank of claim 7, comprising the steps of patterning the resist film, patterning the hard mask film, and patterning the optical film,
the step of patterning the resist film including imagewise writing by electron beam irradiation,
the step of patterning the hard mask film including dry etching with oxygen-containing chlorine-based gas, and
the step of patterning the optical film including dry etching with fluorine-based gas.

10. The photomask blank of claim 1, wherein the hard mask film has an overall thickness of 2.0 nm to less than 9.5 nm.

11. The photomask blank of claim 1, wherein the hard mask film has an overall thickness of 2.0 nm to less than 6 nm.

12. The photomask blank of claim 2, wherein the oxygen content of said second layer is less than 20 atom %, and said third layer is composed of a chromium-based material containing 20 to 60 atom % of oxygen.

13. The photomask blank of claim 12, wherein said second layer contains up to 40 atom % of nitrogen and is free of oxygen.

14. The photomask blank of claim 12, wherein said second layer contains 5 to 40 atom % of nitrogen and is free of oxygen.

15. The photomask blank of claim 2, wherein the oxygen content of said second layer contains is less than 10 atom %, and said third layer is composed of a chromium-based material containing 20 to 60 atom % of oxygen.

16. The photomask blank of claim 15, wherein said second layer contains up to 40 atom % of nitrogen and is free of oxygen.

17. The photomask blank of claim 15, wherein said second layer contains 5 to 40 atom % of nitrogen and is free of oxygen.

18. The photomask blank of claim 4, wherein the light-shielding film consists of a light-shielding function layer and an anti-reflecting function layer.

* * * * *